United States Patent [19]

Tanino et al.

[11] Patent Number: 4,921,928

[45] Date of Patent: May 1, 1990

[54] PIEZOELECTRIC POLYMER MATERIALS FROM EPOXY RESINS AND POLYTETRAMETHYLENEOXIDE-DI-P-AMINOBENZOATE

[75] Inventors: Katsumi Tanino; Morihito Kakada, both of Toyama, Japan

[73] Assignee: Toyokako Kabushiki Kaisha, Namerikawa, Japan

[21] Appl. No.: 208,063

[22] Filed: Jun. 17, 1988

[30] Foreign Application Priority Data

Sep. 7, 1987 [JP] Japan .................................. 62-223722

[51] Int. Cl.$^5$ ................... C08G 59/42; C08G 59/50; C08G 59/56
[52] U.S. Cl. ........................................ 528/111; 528/94; 528/361; 528/407; 525/504; 204/157.82; 204/157.88; 252/62.9
[58] Field of Search .................. 528/94, 111, 361, 407; 525/504

[56] References Cited

U.S. PATENT DOCUMENTS

| | | | |
|---|---|---|---|
| 3,486,925 | 12/1969 | Hoffman | 528/111 |
| 3,577,386 | 5/1971 | Maier | 528/111 |
| 3,580,887 | 5/1971 | Hubin | 528/111 |
| 4,826,616 | 5/1989 | Tanino et al. | 528/111 |

Primary Examiner—John Kight
Assistant Examiner—Frederick Krass
Attorney, Agent, or Firm—Flynn, Thiel, Boutell & Tanis

[57] ABSTRACT

A piezoelectric polymer material comprising a cured product of a composition comprised of an epoxy resin having at least two epoxy groups in the molecules, a compound having a molecular weight not less than 1200 and containing defined numbers of amino groups, benzene rings, carbonyl groups and methylene groups, and a crosslinking agent. The cured product has dipolarly oriented micro crystals therein. A method for making such a piezoelectric polymer material is also described, in which the resin composition is thermally cured and contacted with an electric field at a high temperature to cause dipolar orientation in the product. The dipoles are frozen by cooling the product while applying the electric field.

5 Claims, 1 Drawing Sheet

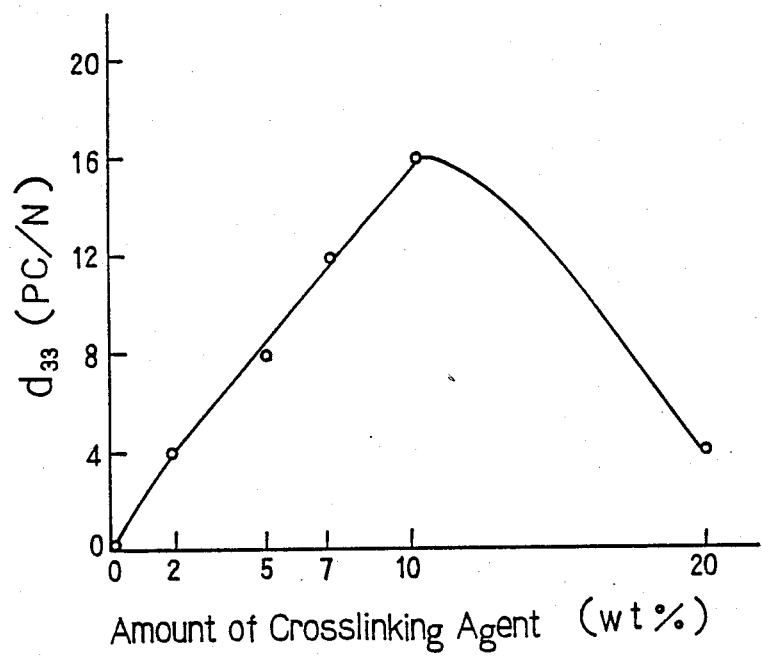
FIGURE

PIEZOELECTRIC POLYMER MATERIALS FROM EPOXY RESINS AND POLYTETRAMETHYLENEOXIDE-DI-P-AMINOBENZOATE

BACKGROUND OF THE INVENTION

1. Field of the Invention

This invention relates to piezoelectric materials and more particularly, to piezoelectric polymer materials which are useful in detection of a grasping force of a manipulator such as of robots and are also useful as a tweeter or an ultrasonic probe for medical purposes. The invention also relates to a method for making such piezoelectric polymer materials.

2. Description of the Prior Art

In recent years, piezoelectric pressure-sensitive elements have wide utility in various fields. These elements make use of a piezoelectric effect in which when a pressure is applied to a material, dielectric polarization takes place along a certain direction, i.e. a positive charge appears at one end with a negative charge developing at the other end. When this piezoelectric effect is utilized, mechanical signals expressed by pressure can be converted into electric signals.

Although piezoelectric polymer materials do not necessarily have very high piezoelectric characteristics, they have a number of advantages in practical applications over known piezoelectric ceramic materials because of their flexibility and capability of forming a large-size or thin film or sheet.

Known piezoelectric polymer materials are, for example, polyvinylidene fluoride (PVDF), copolymers of vinylidene fluoride and trifluoroethylene (VDF/TrFE), and copolymers of vinylidene fluoride and tetrafluoroethylene (VDF/TeFE), and copolymers of vinylidene cyanide and vinyl acetate (VDCN/VA).

However, these known piezoelectric polymer materials have heat resistances as low as approximately 110° C. In addition, they are thermoplastic resins with a linear molecular structure, so that their adhesion to other materials is very poor. Especially, the poor adhesion to other materials presents a serious obstacle in the formation of electrodes when pressures are detected as electric signals. More particularly, the formation of electrodes by adhesion of a conductive, pane or a metallic foil to piezoelectric polymer materials such as PVDF is substantially impossible. The formation of electrodes is usually effected by deposition of, for example, Al. However, the adhesion strength of the electrodes formed by vacuum deposition is not so great. Accordingly, when electrodes are formed on a piezoelectric polymer material and a stress such as pressure is applied thereto over a long time, the electrodes are liable to separate from the piezoelectic material, making it impossible to detect the stress.

On the other hand, polymers, which exhibit good adhesion to other materials to allow relatively easy formation of electrodes, include thermosetting resins such as epoxy resins, phenolic resins and the like. However, these resins are substantially amorphous in nature, so that even though a dipolar orientation operation is effected by application of a high electric field, piezoelectricity is not shown. Accordingly, development of a piezoelectric polymer material from thermosetting polymers has never been accomplished.

SUMMARY OF THE INVENTION

It is therefore an object of the invention to provide a piezoelectric polymer material from a thermosetting epoxy resin whereby the problems involved in the prior art can be solved.

It is another object of the invention to provide a piezoelectric polymer material which has a high heat resistance and good adhesion to other materials, so that the piezoelectric material can be suitably applied for detection of a grasping force of a manipulator of robots and to a medical ultrasonic probe.

It is a further object of the invention to provide a method for making such a piezoelectric polymer material as mentioned above.

The above object can be achieved, according to the invention, by a piezoelectric polymer material which comprises: a cured product of a desired form made of (1) an epoxy resin having at least two epoxy groups in the molecule; (2) a compound having, in the molecule, at least two amino groups, at least two benzene rings, at least two carbonyl groups and at least 52 methylene groups and a molecular weight not less than 1200; and (3) a crosslinking agent for the epoxy resin, the cured product having dipolarly oriented microcrystals therein.

The piezoelectric polymer material is made by a method which comprises mixing suitable amounts of (1) an epoxy resin having two epoxy groups in the molecule, (2) a compound having at least two amino groups, at least two benzene rings, at least two carbonyl groups and at least 52 methylene groups in the molecule and having a molecular weight of not less than 1200, and (3) a crosslinking agent of an imidazole derivative and a pyridine derivative, subjecting the mixture to thermal curing by crosslinkage to form microcrystals therein, contacting the resulting cured product with an electric field to cause dipolar orientation in the product, and freezing the oriented dipoles formed in the product. The dipolar orientation is effected at a temperature of from 100° to 180° C. by application of an electric field of not less than 5 KV/cm. The freezing is carried out by cooling the oriented product to normal temperature while applying the electric field.

The piezoelectric polymer material according to the invention contains microcrystals of long molecule chains by crosslinking an inherently amorphous epoxy resin to the compound having a molecular weight of not less than 1200 with a crosslinking agent. The microcrystals are subjected to dipolar orientation by application of an electric field and the oriented dipoles are frozen, so that a pressure can be detected with high sensitivity. Thus, this type of piezoelectric polymer materials can be used for detection of a grasping force of a manipulator of a robot or used as a medical ultrasonic probe.

The above and other objects, features and advantages of the present invention will become more apparent from the following description taken in conjunction with the accompanying drawings.

BRIEF DESCRIPTION OF THE DRAWINGS

The sole figure is a graphical representation of a piezoelectric strain constant of a piezoelectric longitudinal effect in relation to an amount of a crosslinking agent consisting of imidazole and pyridine derivatives.

DESCRIPTION OF THE PREFERRED EMBODIMENT

The epoxy resins used in the present invention may be a variety of epoxy resins including epoxidized products of unsaturated carboxylates having conjugated or non-conjugated diene linkages, or epoxidized conjugated or non-conjugated cyclic dienes and epoxidized conjugated or non-conjugated dienes, polyglycidyl ethers obtained by reaction between aliphatic diols, aliphatic polyhdric alcohols, bisphenols, phenolnovolacs or cresol-novolacs and epichlorohydrin or beta-methylepichlorohydrin, polyglycidyl esters obtained by reaction between dicarboxylic acids and epichlorohydrin or beta-methylepichlorohydrin, and the like.

The compounds having, in the molecule, at least two amino groups, at least two benzene rings, at least two carbonyl group and at least 52 methylene groups and having a molecular weight of not less than 1200 are, for example, polytetramethyleneoxide-di-p-aminobenzoate which has an amino group at the terminal ends thereof, a benzene ring bonded to the inner side of the respective amino groups, a carbonyl group bonded to the inner side of the respective benzene rings, and at least 13 units, each unit consisting of at least 4 methylene groups, provided at the inner side of the respective carbonyl groups. It is preferred that the aminobenzoate has the amino groups, benzene rings, carbonyl group and methylene groups arranged linearly and symmetrically in the molecule.

When an epoxy resin having at least two epoxy groups in the molecule and the polytetramethyleneoxide-di-p-aminobenzoate having a molecular weight not less than 1200 are reacted, severe curing conditions of not lower than 200° C. and not shorter than 4 hours are necessary. This will invite gradual evaporation of the epoxy resin. In addition, the resultant cured composition remains amorphous. Even if an electric field is applied to the cured composition in order to cause dipoles to be oriented and the oriented dipoles are frozen, little residual polarization is left, thus exhibiting no piezoelectricity.

In general, piezoelectric polymers should preferably have in the molecule methylene groups and amino or carbonyl groups. Moreover, these groups should preferably be arranged linearly with the polymer being crystalline.

In this sense, for development of a piezoelectic thermosetting polymer material from a starting epoxy resin, a material to be reacted with the epoxy resin should favorably have methylene groups, amino groups and carbonyl groups. Especially, the methylene groups should be large in number and these groups should be arranged linearly. Further, from the standpoint of the polymerization reaction with an epoxy resin, materials to be reacted with the epoxy resin should preferably have a benzene ring or rings in the molecule.

As described before, the cured composition or product obtained by reaction between the epoxy resin and the polyteramethyleneoxide-di-p-aminobenzoate exhibits little piezoelectricity. The main reason why piezoelectricity is rarely exhibited is due to the fact that the cured product is amorphous. In order to impart crystallinity to the cured product, addition of a crosslinking agent is necessary.

The crosslinking agent may selected from of curing agents for epoxy resins, promotors, radical reaction intiators, and the like. Preferably, mixtures of imidazole derivatives and pyridine derivatives are used. If an imidazole derivative or a pyridine derivative is used singly, formation of a crystalline composition or product will not proceed smoothly. Accordingly, the crosslinking agent used to cure an epoxy resin and polytetramethleneoxide-di-p-aminobenzoate for imparting crystallinity to the resulting product should preferably be a mixture of an imidazole derivative and a pyridine derivative. When this type of crosslinking agent is used, a satisfactory cured product can be obtained under curing conditions of, for example, 160° and 1 hour. It has been confirmed through X-ray diffraction that the thus obtained product is polycrystalline or finely crystalline.

Specific examples of the imidazole derivatives include 2-ethyl-4-methylimidazole, and the like. Specific examples of the pyridine derivatives include 2,6-pyridinecarboxylic acid, 2,5-pyridinedicarboxylic acid, 3,4-pyridinedicarboxylic acid, 3,5-pyridinedicarboxylic acid, 4-pyridineethanesulfonic acid, 3-pyridinesulfonic acid, 4-(aminomethyl) pyridine, 3-(aminomethyl) pyridine, and the like.

The epoxy resin compositions of the ingredients set forth above should preferably comprise 100 parts by weight of the epoxy resin, from (70) to (85) parts by weight of the compound having a molecular weight not less than 1200, and from (10) to (30) parts by weight of a crosslinking agent. By this, the resulting, cured composition or product is ensured of having fine crystals therein.

The method for making the piezoelectric polymer material according to the invention is described.

First, an epoxy resin having at least two epoxy groups in the molecule and a compound having, in the molecule, at least two amino groups, at lest two benzene rings, at least two carbonyl groups and not less than 52 methylene groups and having a molecular weight of not less than 1200 (e.g. polytetramethyleneoxide-di-p-aminobenzoate) are mixed, to which a crosslinking agent for the epoxy resin made of a mixture of an imidazole derivative and a pyridine derivative is added. It is preferred that the mixture is liquid at normal temperatures and can be cast. Accordingly, the epoxy resin used should preferably be a liquid at normal temperatures.

The mixture is subsequently shaped or cast into a desired form such as a sheet and heated to cause a crosslinking and curing reaction. The curing reaction is preferably effected at 140° to 200° C., more preferably at 150° to 180° C. This is because when the temperature is lower than 140° C., the curing reaction undesirably takes a long time. Over 200° C., the epoxy resin will unfavorably start to evaporate.

The cured product of a desired from is then coated on opposite sides thereof with a conductive paint such as, for example, a conductive silver paint, to form electrodes. A DC electric field is applied between the electrodes at a temperature of from 100° to 180° C., preferably from 120° to 160° C., thereby causing dipolar orientation in the cured product. Subsequently, while maintaining the application of the voltage, the temperature is lowered to normal temperatures whereupon the application of the voltage is stopped. If the temperature at which the dipolar orientation is effected is lower than 100° C., polarization will become insufficient. Over 180° C., there is an undesirable tendency toward dielectric breakdown. The electric field applied for the dipolar orientation should preferably be not less than 5 KV/cm. Below 5 KV/cm, there is the possibility that the polarization does not proceed satisfactorily.

The piezoelectric polymer material may be in the form of a sheet as stated above or may have any form such as a very thin film of approximately 10 micrometers formed by a screen printing technique.

The piezoelectric polymer material of the invention has good adhesion properties and a good heat resistance, and is capable of detecting a pressure with high sensitivity.

The present invention is more particularly described by way of example, which should not be construed as limiting the present invention. Example Bisphenol F-type epoxy resin (Epikote 807, available from Yuka Shell Epoxy Kabushiki Kaisha) was provided as an epoxy resin having at least two epoxy groups in the molecule. Polytetramethyleneoxide-di-p-aminobenzoate (Elastomer 1000, available from Ihara Chem. Ind. Co., Ltd.) was provided as a compound having, in the molecule, at least two amino groups, at least two benzene rings, at least two carbonyl groups and at least 52 methylene groups and having a molecular weight of not less than 1200. 100 parts by weight of the bisphenol F-type epoxy resin and 85 parts by weight of the polytetramethyleneoxide-di-p-aminobenzoate were mixed under agitation to obtain a uniform solution (a solution having this mixing ratio is hereinafter referred to as material A).

Thereafter, 2-ethyl-4-methylimidazole (reagent, available from Wako Junyaku Ind. Co., Ltd.) was provided as an imidazole derivative, and 2,6-pyridinecarboxylic acid was provided as a pyridine derivative. 100 parts by weight of 2-ethyl-4-methylimidazole and 50 parts by weight of 2,6-pyridinecarboxylic acid were mixed under agitation to obtain a uniform solution (the solution having this mixing ratio is hereinafter referred to as material B).

The material B was added to the material A in different amounts of 0, 2, 5, 7, 10 and 20 wt % and mixed under agitation to obtain six solutions. The thus obtained solutions were each poured into a teflon container having an inner dimension of 10 cm×10 cm×1 cm in a thickness of 0.1 mm, followed by thermally curing at temperatures of from 160° to 200° C. for 1 to 4 hours. As a result, six types of piezoelectric polymer materials in the form of a sheet were made.

These sheets were each cut into 2 cm square pieces for use as test samples. Six types of the test samples were contacted with a DC electric field of 50 KV/cm at a temperature of 160° C. for 30 minutes and cooled down to normal temperature while applying the electric field.

The respective piezoelectric samples were connected to a charge amplifier to measure a piezoelectric characteristic, i.e. a piezoelectric strain constant.

The results are shown in the sole figure, in which the units of $d_{33}$ have such meanings that P is pico ($10^{12}$), C is coulomb, and N is newton.

The piezoelectric strain constant was measured as follows.

Each test sample was set in a piezoelectric strain constant measuring apparatus having a pressure signal generator, a pressurization unit, a charge amplifier and a synchroscope. The test sample had a pressure applied by means of the pressurizing unit and an electric charge produced in the sample was converted into a voltage. This voltage was displayed on the synchroscope, from which the piezoelectric strain constant was determined.

Although the invention has been described in its preferred form with a certain degree of particularity, it is to be understood that many variations and changes are possible in the invention without departing from the scope thereof.

What is claimed is:

1. A piezoelectric polymer material which comprises: a cured product made from (1) an epoxy resin having at least two epoxy groups; (2) a compound having, at least two amino groups, at least two benzene rings, at least two carbonyl groups and at least 52 methylene groups and having a molecular weight not less than 1200; and (3) a crosslinking agent for the epoxy resin, said cured product having dipolarly oriented microcrystals therein.

2. A piezoelectric polymer material according to claim 1, wherein the at least two amino groups, the at least two benzene rings, the at least two carbonyl groups and the at least 52 methylene groups of compound (2) are arranged linearly.

3. A piezoelectric polymer material according to claim 1, wherein compound (2) is polytetramethyleneoxide-di-p-aminobenzoate.

4. A piezoelectric polymer material according to claim 1, wherein said crosslinking agent is a mixture of an imidazole derivative and a pyridine derivative.

5. A piezoelectric polymer material according to claim 1, wherein said cured product is made of 100 parts by weight of said epoxy resin, from (70) to (85) parts by weight of said compound, and from (10) to (30) parts by weight of said crosslinking agent.

* * * * *

UNITED STATES PATENT AND TRADEMARK OFFICE
CERTIFICATE OF CORRECTION

PATENT NO. : 4,921,928
DATED : May 1, 1990
INVENTOR(S) : Katsumi TANINO et al

It is certified that error appears in the above-identified patent and that said Letters Patent is hereby corrected as shown below:

On the title page, at item [75] change the surname of the second inventor to ---Nakada---.

Signed and Sealed this

Seventh Day of April, 1992

Attest:

HARRY F. MANBECK, JR.

*Attesting Officer*     *Commissioner of Patents and Trademarks*